(12) United States Patent
Quevy et al.

(10) Patent No.: US 7,982,550 B1
(45) Date of Patent: Jul. 19, 2011

(54) HIGHLY ACCURATE TEMPERATURE STABLE CLOCK BASED ON DIFFERENTIAL FREQUENCY DISCRIMINATION OF OSCILLATORS

(75) Inventors: Emmanuel P. Quevy, El Cerrito, CA (US); Manu Seth, San Jose, CA (US)

(73) Assignee: Silicon Laboratories, Austin, TX (US)

(*) Notice: Subject to any disclaimer, the term of this patent is extended or adjusted under 35 U.S.C. 154(b) by 363 days.

(21) Appl. No.: 12/217,190

(22) Filed: Jul. 1, 2008

(51) Int. Cl.
 *H03B 5/32* (2006.01)
(52) U.S. Cl. ............................. 331/176; 331/66; 331/2
(58) Field of Classification Search .................. 331/176, 331/2, 66, 56; 327/298
 See application file for complete search history.

(56) References Cited

U.S. PATENT DOCUMENTS

| | | | |
|---|---|---|---|
| 6,831,525 B1 * | 12/2004 | Beaudin et al. | 331/176 |
| 7,211,926 B2 | 5/2007 | Quevy et al. | |
| 7,212,075 B2 * | 5/2007 | Young et al. | 331/176 |
| 7,760,036 B2 * | 7/2010 | Sutardja | 331/108 C |

OTHER PUBLICATIONS

Rafael J. Betancourt Zamora et al. "A 1.5mW, 200MHz CMOS VCO for Wireless Biotelemetry", Center for Integrated Systems, Dept of Electrical Engineering, Stanford University, Stanford, California, pp. 1-14.

* cited by examiner

*Primary Examiner* — Joseph Chang
(74) *Attorney, Agent, or Firm* — O'Keefe, Egan, Peterman & Enders LLP

(57) ABSTRACT

An apparatus and a method for compensating for a mismatch in temperature coefficients of two oscillator frequencies to match a desired frequency ratio between the two oscillator frequencies over a temperature range. In one embodiment of a temperature sensor, first and second oscillators of different temperature characteristics are coupled to a differential frequency discriminator (DFD) circuit. The DFD circuit compensates for the different characteristics in order to match a frequency difference between the first and second frequencies over a temperature range.

30 Claims, 8 Drawing Sheets

HIGHLY ACCURATE TEMPERATURE STABLE CLOCK BASED ON DIFFERENTIAL FREQUENCY DISCRIMINATION OF OSCILLATORS

TECHNICAL FIELD

Embodiments of the invention relate to the field of precision timing; and more specifically, to oscillator-based precision timing applications.

BACKGROUND

A resonator is a device or system that exhibits resonance or resonant behavior, that is, it naturally oscillates at some frequencies, called its resonance frequencies, with greater amplitude than at others. Resonators can be, for example, crystal oscillators (also known as quartz oscillators), inductance-capacitive (LC) oscillators, resistance-capacitive (RC) oscillators, and Microelectromechanical systems (MEMS) oscillators, also referred to as micromechanical MEMS oscillators. A crystal oscillator is an electronic circuit that uses the mechanical resonance of a vibrating crystal of piezoelectric material to create an electrical signal with a very precise frequency. Crystal oscillators, such as quartz oscillators, are commonly used to generate frequencies to keep track of time (as in quartz clocks) or to generate a clock signal for digital integrated circuits. Usually, a different crystal is required for each desired frequency. Also, the crystal and the oscillator circuit compliments are typically distinct from one another, i.e., they are not integrated.

For the past several years, MEMS structures have been playing an increasingly important role in consumer products. For example, it has been shown that radio-frequency (RF) surface micro-machined MEMS resonators were potential replacement part for quartz resonators in reference oscillator applications, as well as for other applications to keep track of time and to generate a stable clock signal for digital integrated circuits. The main advantage relies in the form factor and path to on-chip integration, but this advantage is balanced with the accuracy of the resonance frequency and higher temperature drift of MEMS resonators.

As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-two-device) often dictate that the processes used to fabricate such MEMS devices need to be extremely sophisticated.

In certain applications, the temperature stability and initial accuracy of resonators is particularly important, especially for MEMS resonators. Uncompensated MEMS resonators have a temperature coefficient that can be approximately forty parts per million per degrees Celsius (i.e., 40 ppm/° C.), whereas quartz oscillators can be approximately 0.035 ppm/° C. without any special compensation. For example, in the context of sleep clock applications, which use resonators with inherent accuracy of +/−20 ppm, quartz oscillators have tighter initial accuracy, smaller temperature drift, and can be fine tuned with capacitive pulling in the oscillator circuit, as compared to uncompensated MEMS oscillators. Whereas, state of the art quartz resonators, such as in wireless handset applications, exhibits frequency tolerance of +/−2 ppm after hand trimming involving deposition of infinitesimal quantity of metal at the quartz surface. For the same application, it has become clear that laterally vibrating bulk resonators were the structures of choice to fulfill application requirements in term of frequency, quality factor and power handling. But, in the case of surface micro-machined MEMS resonators, one can evaluate to the first order the fabrication tolerance on the absolute resonance frequency using tolerance on the lateral dimensions. State of the art lithography tools can achieve +/−15 nm in tolerance. For GSM/CDMA, typical resonator dimensions are in the range of 30-60 µm. This translates into an absolute tolerance of higher than 200 ppm. This already high value compared to quartz is assumed without taking into account effect of the stress in the package and other non-idealities in the micromachining process (anchors, alignment between layers, anisotropy, etc.) and makes a difficult trimming of the frequency necessary.

In terms of thermal characteristic, research has shown that surface micro-machined resonators (polysilicon, silicon-germanium, or piezoelectric) exhibit a temperature drift of more than 2500 ppm over a −30° C. to 85° C. range. This makes the use of compensation techniques developed for quartz crystal oscillators very difficult, where a typical AT-cut first mode resonator experiences a maximum excursion of +/−20 ppm over the full temperature range.

Some conventional approaches have been used in quartz oscillators to improve initial accuracy and temperature stability. One such conventional approach uses a varactor to pull a sleep clock resonant frequency to improve temperature stability, such as described in U.S. Pat. No. 6,160,458. However, this approach is not used in the context of MEMS oscillators. Other approaches may include electrostatic pulling in open-loop configuration, capacitive pulling through load capacitance, encapsulation of the device into micro-oven to keep temperature constant during fabrication, mechanical compensation of temperature drift, and Fractional-N PLL with reference drifting. Also, since uncompensated quartz oscillators have a lower temperature coefficient than MEMS oscillators, these conventional approaches are not used in a wide range of temperatures for temperature compensations of the oscillator.

Furthermore, traditional electrostatic pulling is not effective in high-frequency MEMS oscillators. High-frequency MEMS resonators, such as MEMS resonators having approximately 1 MHz frequency or greater, for example, have a very high equivalent stiffness that causes them to have a very small electrostatic frequency pulling range. In MEMS oscillators, capacitive pulling, like used in quartz-based oscillators, may also not be effective to adjust the output frequency for both initial accuracy and temperature stability due to extremely small effective capacitance of the MEMS resonators. For these reasons, new methods must be used to adjust the output frequency for both initial accuracy and temperature compensation over a wide range of temperatures for all types of resonators, such as quartz-based and MEMS oscillators.

BRIEF DESCRIPTION OF THE DRAWINGS

The invention may best be understood by referring to the following description and accompanying drawings that are used to illustrate embodiments of the invention. In the drawings.

DETAILED DESCRIPTION

Figure 1:
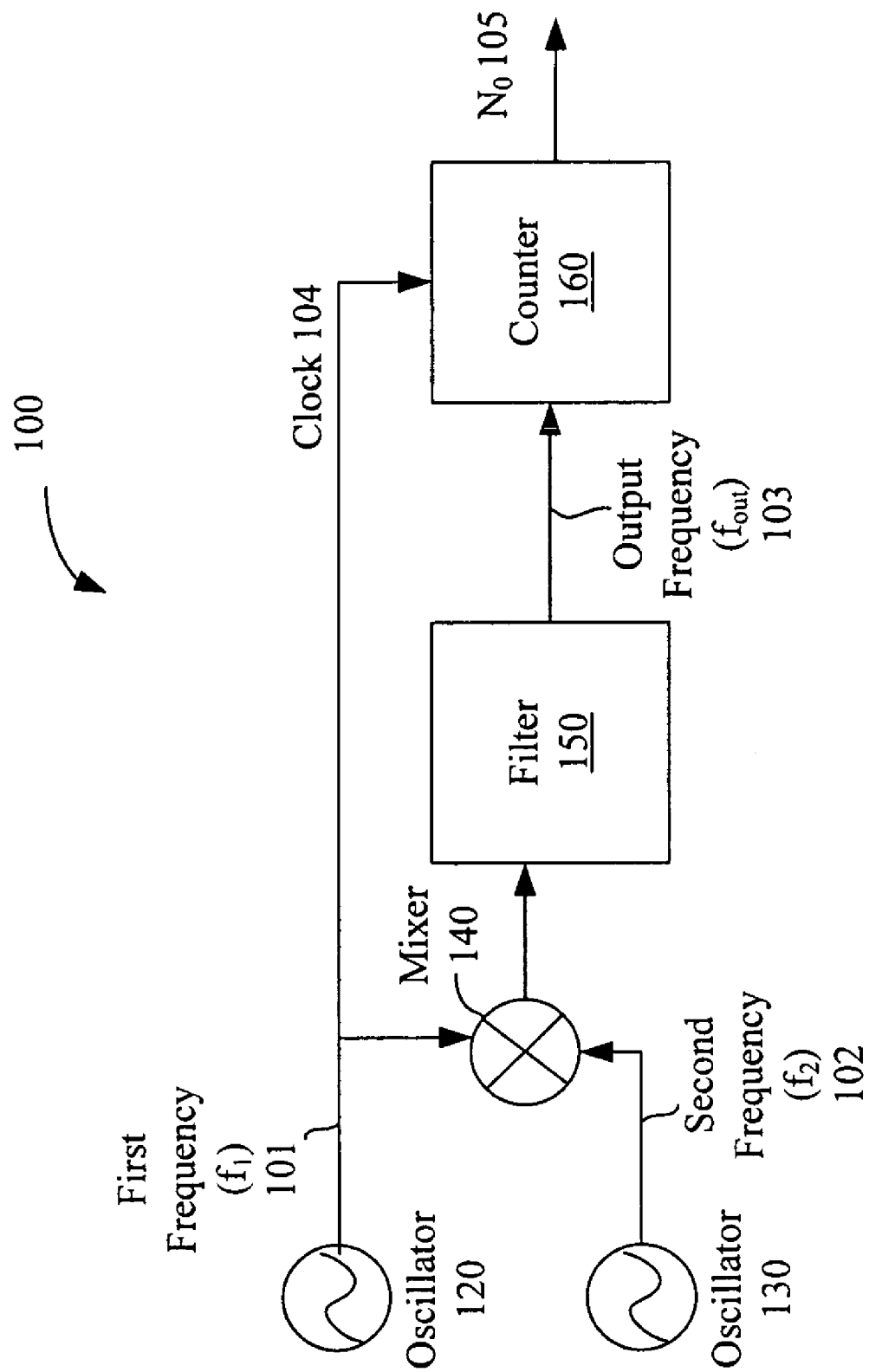
FIG. 1 is a block diagram of a MEMS resonator based temperature sensor.

Disclosed herein is a differential frequency discriminator. In particular, the embodiments described herein are directed to apparatuses and methods for compensating for a mismatch in temperature coefficients of two oscillator frequencies to match a desired frequency ratio between the two oscillator frequencies over a temperature range. In one embodiment of a temperature sensor, first and second oscillators of different temperature characteristics are coupled to a differential frequency discriminator (DFD) circuit. The DFD circuit compensates for the different characteristics in order to match a frequency difference between the first and second frequencies over a temperature range.

In the following description, for purposes of explanation, numerous specific details are set forth, such as material compositions and chemical regimes, in order to provide a thorough understanding of the invention. It should be apparent to one skilled in the art that the present invention may be practiced without these specific instances. In other instances, well-known features, such as circuits, structures, and techniques, are not described in detail in order to no unnecessarily obscure the present invention. Furthermore, it should be understood that various embodiments shown in the Figures are illustrative representations and are not necessarily drawn to scale.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The embodiments described herein are directed to delivering a stable, accurate frequency clock output. In one embodiment, two MEMS oscillators with similar properties is coupled to a differential frequency discriminator (DFD) circuit to lock the oscillator signals in phase and frequency through a frequency-locked loop (FLL). The oscillator outputs are mixed and the frequency difference is filtered and buffered as the output signal. In one embodiment, the DFD circuit is a differential pair and a current mirror, which are coupled to a mixer and a filter (e.g., low pass or band pass) going to the output buffer.

The embodiments described herein are useful for various types of resonators, such as MEMS, LC, and RC resonators, to improve initial accuracy and temperature stability due to the resonators size, and in some embodiments, due to the integration of the resonators on the integrated circuits itself (e.g., MEMS oscillators). For example, using the ability to stack oscillators (Silicon Germanium for example) directly on top of CMOS chips, it is possible to dispose multiple oscillators on the integrated circuit which includes the other circuitry, including the DFD circuit. Although various embodiments described herein are described with respect to MEMS oscillators, these embodiments may be used to improve the performance of quartz oscillators.

The embodiments described herein may be implemented as two oscillators (e.g., MEMS oscillators, or other types of oscillators) that are switching two capacitor networks connected as loads of a current mirror. The switching frequencies determine the current in each branch of the current mirror, and are forced to be equal through the current mirror. The capacitive load and current set the control voltage that is feedback into each oscillator. The two oscillators are then locked to each other so that the frequency difference remains constant through a temperature range. The oscillators may be designed to be voltage controllable through a varactor, electrostatic pulling, or the like. In another embodiment, the oscillators may be tuning fork oscillators, such as a double Ended Tuning Fork (DETF) oscillator. Other techniques may be used to control the frequency of the oscillator(s), depending on the type of oscillators that is being used. The two oscillator signals are mixed to generate the clock frequency output as a frequency difference of two frequencies which remain constant as a measure of temperature and voltage. A filter may be used to keep the target mixing product of the frequency difference (e.g., $F_{out}=f_1-f_2$). In order to trim the output frequency, the capacitance ratio of the capacitive loads in the current mirror can be set (e.g., $$F_{out} = \left(1 - \frac{C_1}{C_2}\right) \cdot f_{10},$$

where $f_{10}$ is the frequency at the trimming temperature), to trim one or both frequencies to obtain the desired frequency ratio between the two frequencies. After obtaining the desired frequency ratio, the desired frequency ratio may be maintained by compensating for temperature drifts caused by the temperature coefficients ($TC_f$) of the two oscillators. Instead of trying to obtain an absolute temperature coefficient that is zero across process variations for the oscillators, the embodiments described herein rely on matching and locking the two frequencies to compensate for any mismatch in the temperature coefficients of the two oscillators in order for the frequency difference between the two frequencies to remain constant. The embodiments described herein keep the two oscillators locked, for example, by pulling resonator to keep the frequency ratio constant, which improves the stability of the output frequency over a range of temperatures. In addition, matching of transistors, capacitors, resonator frequency, and resonator temperature slope may increase the performance of the clock output in terms of accuracy over temperature. Also, a temperature sensor may be added to further trim the value of the discriminating capacitor $C_1$ and $C_2$ (e.g., variable capacitive load) in order to improve stability.

In one embodiment, the DFD circuit is coupled to receive a first signal having a first frequency from a first oscillator and a second signal having a second frequency from a second oscillator. The DFD circuit compensates for the mismatch in temperature coefficients to match a frequency difference between the first and second frequencies over a temperature range. In one embodiment, the DFD circuit compensates for the mismatch by tuning at least one of the first or second frequencies to obtain a desired frequency ratio between the first and second frequencies. Once the desired frequency ratio has been obtained, the DFD circuit locks the first and second frequencies at the desired frequency ratio to maintain the desired frequency ratio constant over the temperature range. In one embodiment, the DFD circuit includes two frequency-to-voltage converters (FVCs) to convert the first and second frequencies to a first voltage and a second voltage, respectively, and a compensation circuit to match and lock the first and second frequencies at the desired frequency ratio over the temperature range using the first and second voltages. The two FVCs may be disposed in the feedback loop of the two oscillators. In one embodiment, each of the two FVCs has a variable capacitive load. In another embodiment, one of the capacitive loads is a fixed capacitive load and the other is a variable capacitive load (also referred to as a tunable capacitive load). The variable capacitive load may be a capacitor network, a varactor, a capacitor bank, or the like. In another embodiment, the DFD circuit includes variable capacitor circuits that are connected as loads of a current mirror of transistors. The capacitance value and the current set the control voltage fed back into each of the two oscillators to tune one or both frequencies of the oscillators. The current mirror also operates to lock the oscillators to each other so that the frequencies have a constant frequency ratio over a temperature range.

The embodiments described herein may provide one or more advantages over the conventional approaches. In particular, the embodiments described herein may be used in oscillator applications that need to compensate for temperature drift, especially for oscillators that have large temperature coefficients ($TC_f$). The embodiments described herein may use smaller, lower-costing resonators (e.g., MEMS, LC, or RC) without sacrificing accuracy and temperature stability, as compared to the size, cost, and performance of quartz-based resonators. The embodiments described herein may also be used to improve the performance of quartz-based resonators. The embodiments described herein may be applied to compensated or un-compensated resonators. The embodiments described herein are directed to trimming and compensating for temperature stability of the output clock signal, and relies on differential matching, rather than absolute, which may result in better accuracy and manufacturability. The embodiments described herein may be applied to low and high frequencies, and allows optimization of phase noise. For example, by generating the output frequency of 25 MHz from a higher frequency, such as 100 MHz or 75 MHz, the phase noise from the references is divided down, provided the mixer does not introduce additional noise. The locking functionality of the embodiments described herein helps compensate for mismatches in temperature coefficients, whether large or small. Also, since the temperature compensation does not rely on large tunability of the resonator frequency, both series resonance and high-frequency resonators, such as resonators having a frequency of approximately 1 MHz or greater, can be used. Instead, in some embodiments, the output frequency is trimmed by the ratio of the load capacitors to tune the resonator frequency to high accuracy. Using the embodiments described herein, the accuracy may be approximately 1 ppm or better. Also, because differential matching is used, no voltage supply is needed for a voltage reference. As such, the embodiments described herein do not required bandgap circuitry for the voltage references, since the circuits are not sensitive to supply variation. However, in other embodiments, bandgap circuitry may be used for reducing the Power Supply Rejection Ratio (PSRR) from other noise sources. In other embodiments, a filter in the DFD circuit can be used to remove any additional noise source. In yet other embodiments, a temperature sensor can coupled to the DFD circuit to improve the response over temperature by tuning the capacitor ratio over the temperature range. Using the embodiments described herein, there is no limitation on the achievable frequency range.

FIG. 1 is a block diagram of a MEMS resonator based temperature sensor 100. The temperature sensor 100 includes a first oscillator 120, a second oscillator 130, a mixer 140, a filter 150, and a counter 160. The first oscillator 120 provides a first frequency ($f_1$) 101, and the second oscillator 130 provides a second frequency ($f_2$) 102. The mixer 140 mixes the first frequency ($f_1$) 101 and the second frequency ($f_2$) 102, and the output frequency ($f_{out}$) 103 of the mixer 140 is applied through the filter 150 to the counter 160. The counter 160 receives the output frequency ($f_{out}$) 103, and the first frequency ($f_1$) 101 as a clock signal 104. The counter 160 generates a count 105 ($N_0$) which is a digital representation of the signal frequency of the output frequency ($f_{out}$) 103. Unlike other conventional quartz-based temperature sensing methods (e.g., Dual-mode oscillators), which rely on the use of higher harmonic with the same resonator to measure the difference in frequency drift as a function of temperature, which set the frequency difference by the geometry of the quartz, and which select the mode for measurement, the temperature sensor 100 can independently set the resonance frequency and the temperature drift. Unlike the dual-mode quartz based oscillators, both modes can be set at the exact same frequency which saves the use of a multiplier in the first oscillator path to the mixer. The equation (1) shows the temperature characteristic of one MEMS resonator based oscillator, referenced at (f0, T0) so that $\Delta T = T - T0$.

$$\frac{\Delta f}{f} = \alpha_{1,i} \cdot \Delta T + \alpha_{2,i} \cdot \Delta T^2 + \alpha_{3,i} \cdot \Delta T^3 \quad (1)$$

The measured frequency, called "beat frequency" (output frequency ($f_{out}$) 103), is given by the following equation (2):

$$f_{out} = f_1 - f_2 \quad (2)$$

The temperature characteristic can be derived, as set forth in equation (3), in terms of each resonator temperature characteristic:

$$\frac{\Delta f_{out}}{f_{out}} = \frac{1}{1-N} \cdot \frac{\Delta f_1}{f_1} - \frac{N}{1-N} \cdot \frac{\Delta f_2}{f_2}, \text{ where } N = \frac{f_2}{f_1} \quad (3)$$

As such, the frequency drift is expressed in equation (4), as a function of temperature:

$$\frac{\Delta f_{out}}{f_{out}}(T) = \quad (4)$$

$$\frac{\alpha_{1,1} - N \cdot \alpha_{1,2}}{1-N} \cdot \Delta T + \frac{\alpha_{2,1} - N \cdot \alpha_{2,2}}{1-N} \cdot \Delta T^2 + \frac{\alpha_{3,1} - N \cdot \alpha_{3,2}}{1-N} \cdot \Delta T^3$$

The beat frequency (output frequency ($f_{out}$) 103) is then measured by the counter 160. This can be a frequency or period meter that provides a near linear function of temperature.

As stated before, because the two oscillators are independent, resonance frequencies are independent, unlike quartz resonators where the frequencies are related to each other by the order of their mode. Although the resonant frequencies may be designed so that each oscillator structure as close as possible, the linear temperature coefficient may be mismatched.

Figure 2:
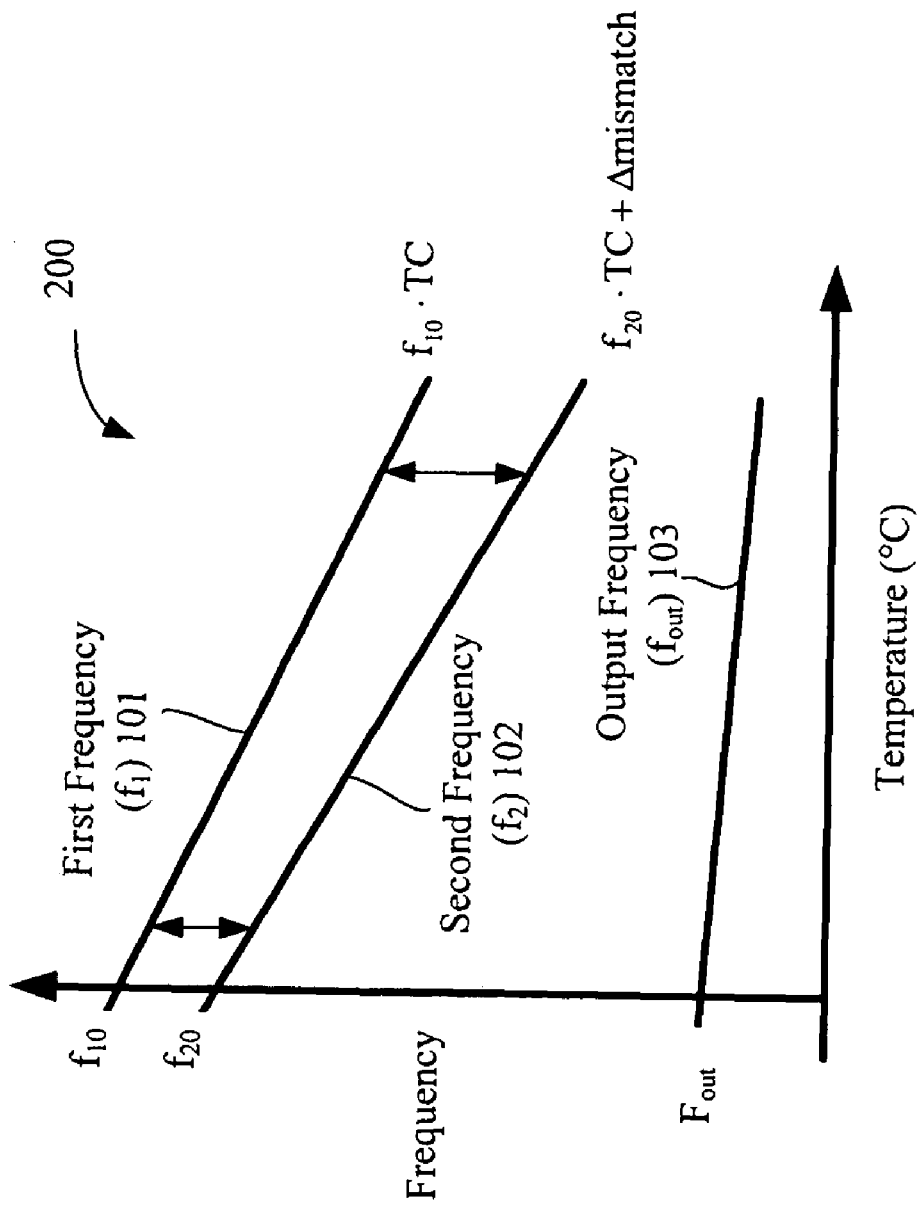
FIG. 2 is a graph illustrating frequency response of two oscillator frequencies having a mismatch in temperature coefficients over a functional temperature range.

FIG. 2 is a graph 200 illustrating frequency response of two oscillator frequencies having a mismatch in temperature coefficients over a functional temperature range. The graph 200 illustrates the linear temperature coefficients of the two oscillators 120 and 130 over the functional temperature range. Although both the first frequency ($f_1$) 101 and second frequency ($f_2$) 102 decrease over the temperature range, the first and second frequencies decrease at different rates, according to the mismatch in temperature coefficients. The frequencies $f_{10}$ and $f_{20}$ represent the frequencies of the first and second frequencies 101 and 102 at the trimming temperature. The frequency ratio of the first and second frequencies 101 and 102 at the trimming temperature may be the desired frequency ratio, however, as the temperature increases the desired frequency ratio increases, as a result of the mismatch between the temperature coefficients of the two oscillators. For example, towards the upper end of the temperature range, the first frequency ($f_1$) 101 is represented by the following equation (5), and the second frequency ($f_2$) 102 is represented by the following equation (6), where $TC_{f1}$ and $TC_{f2}$ are the temperature coefficients of the first and second oscillators 120 and 130, respectively.

$$f_1 = f_{10} \cdot TC_{f1} \quad (5)$$

$$f_2 = f_{20} \cdot (TC_{f2} + \Delta \text{mismatch}) \quad (6)$$

As a result of the mismatch, the resulting output, output frequency ($f_{out}$) 103, does not remain constant over the entire temperature range.

As described in U.S. Pat. No. 7,211,926 to Quevy et al, while their linear temperature coefficients may be different, in order to provide a more accurate output frequency, one can maximize the beat frequency linear coefficient for high temperature sensitivity by designing each structure (e.g., MEMS oscillator) so that the resonance frequencies are as close as possible. At the same time, higher order coefficients $\alpha_{2,i}$ and $\alpha_{3,i}$ of each resonator are close enough to have the beat frequency non-linear coefficients close to zero. The tolerance on the measurement, i.e. the beat frequency (output frequency ($f_{out}$) 103) is thus given by the relative tolerance between the frequency of the resonators which can be made small through careful layout matching made possible by the fact that both resonators are integrated on-chip and close to each other. However, the embodiments described below are directed to apparatuses and methods for compensating for the mismatch in temperature coefficients of two oscillator frequencies, described above, to match a desired frequency ratio between the two oscillator frequencies over a temperature range, despite manufacturing mismatches between oscillators. In particular, by matching and locking the two oscillators at the desired frequency ratio over the temperature range, the oscillators can be manufactured to compensate for the mismatch without careful tailoring the temperature characteristics of the oscillators, or careful layout matching of the two oscillators, as described above. Also, one does not have to take advantage of the thermal expansion coefficient mismatch between the structural layer and the silicon substrate to set the overall temperature coefficient of each oscillator. As such, by matching the two oscillators at the desired frequency ratio and locking the two oscillators at the desired frequency ratio over the temperature range, the overall temperature coefficient of the temperature sensor 300 can be set.

Figure 3:
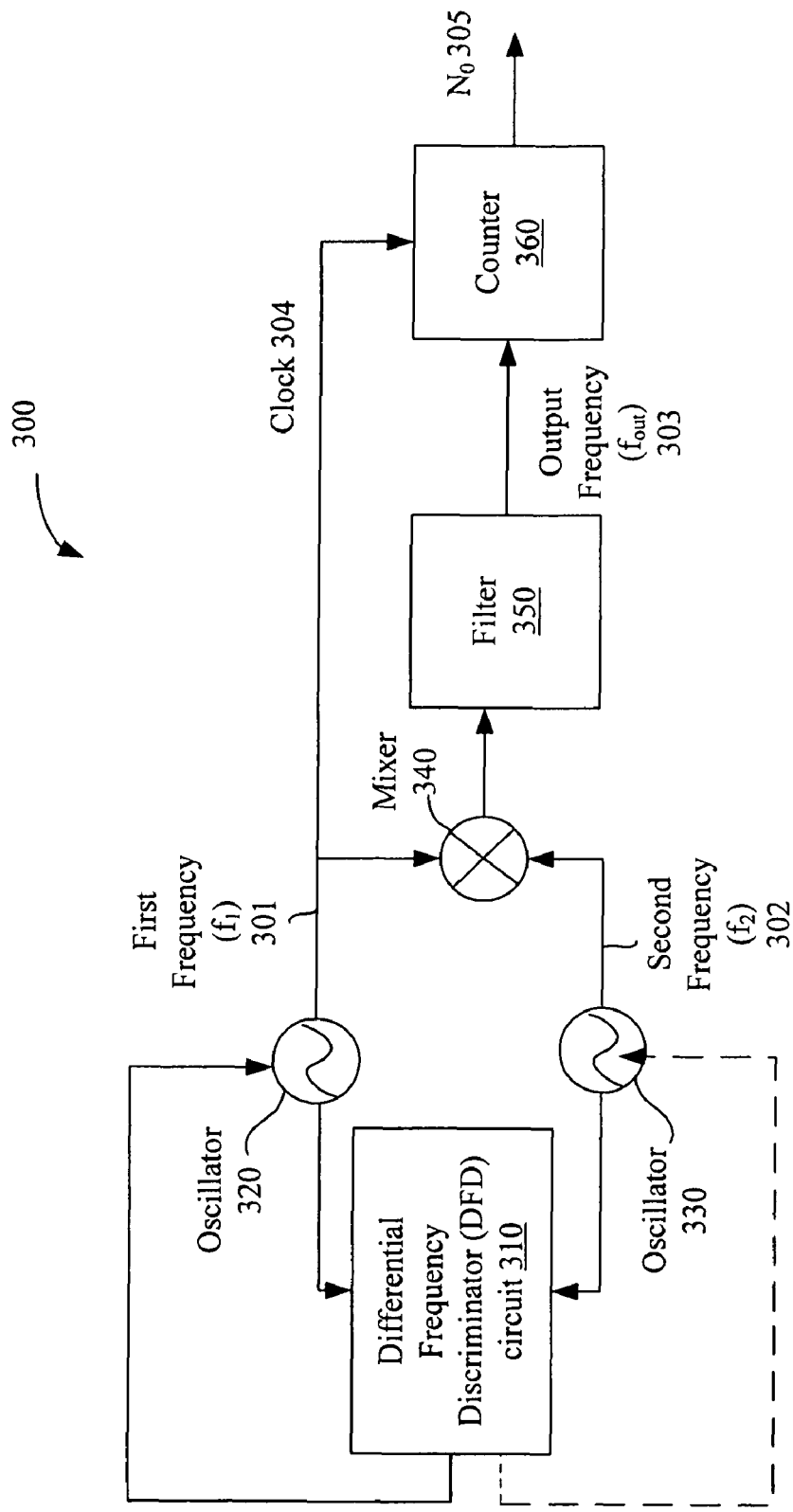
FIG. 3 is a block diagram of a temperature sensor having two oscillators and a differential frequency discriminator (DFD) circuit, according to one embodiment.

FIG. 3 is a block diagram of a temperature sensor having two oscillators and a differential frequency discriminator (DFD) circuit, according to one embodiment. The temperature sensor 300 includes the DFD circuit 310, a first oscillator 320, a second oscillator 330, a mixer 340, a filter 350, and a counter 360. In one embodiment, the first and second oscillators 320 and 330 are MEMS oscillators. In another embodiment, the first and second oscillators 320 and 330 are quartz oscillators. Alternatively, the first and second oscillators 320 and 330 may be LC oscillators, RC oscillators, or the like. The first oscillator 320 provides a first frequency ($f_1$) 301, and the second oscillator 330 provides a second frequency ($f_2$) 302. The mixer 340 mixes the first frequency ($f_3$) 301 and the second frequency ($f_2$) 302, and the output frequency ($f_{out}$) 303 of the mixer 340 is applied through the filter 350 to the counter 360. The counter receives the output frequency ($f_{out}$) 303, and the first frequency ($f_1$) 301 as a clock signal 304. The counter 360 generates a count 305 ($N_0$) which is a digital representation of the signal frequency of the output frequency ($f_{out}$) 303. The temperature sensor 300 is similar to the temperature sensor 100 described above, except the temperature sensor 300 includes the DFD circuit 310 to compensate for the mismatch of temperature coefficients between the first and second oscillators 320 and 330.

The DFD circuit 310 receives the first and second frequencies 301 and 302 and compensates for the mismatch in temperature coefficients to match a frequency difference between the first and second frequencies over a temperature range. In one embodiment, the DFD circuit 310 compensates for the mismatch by tuning at least one of the first frequency 301 or second frequency 302 to obtain a desired frequency ratio between the first and second frequencies 301 and 302. Once the desired frequency ratio has been obtained, the DFD circuit 310 locks the first and second frequencies 301 and 302 at the desired frequency ratio to maintain the desired frequency ratio constant over the temperature range.

Figure 4:
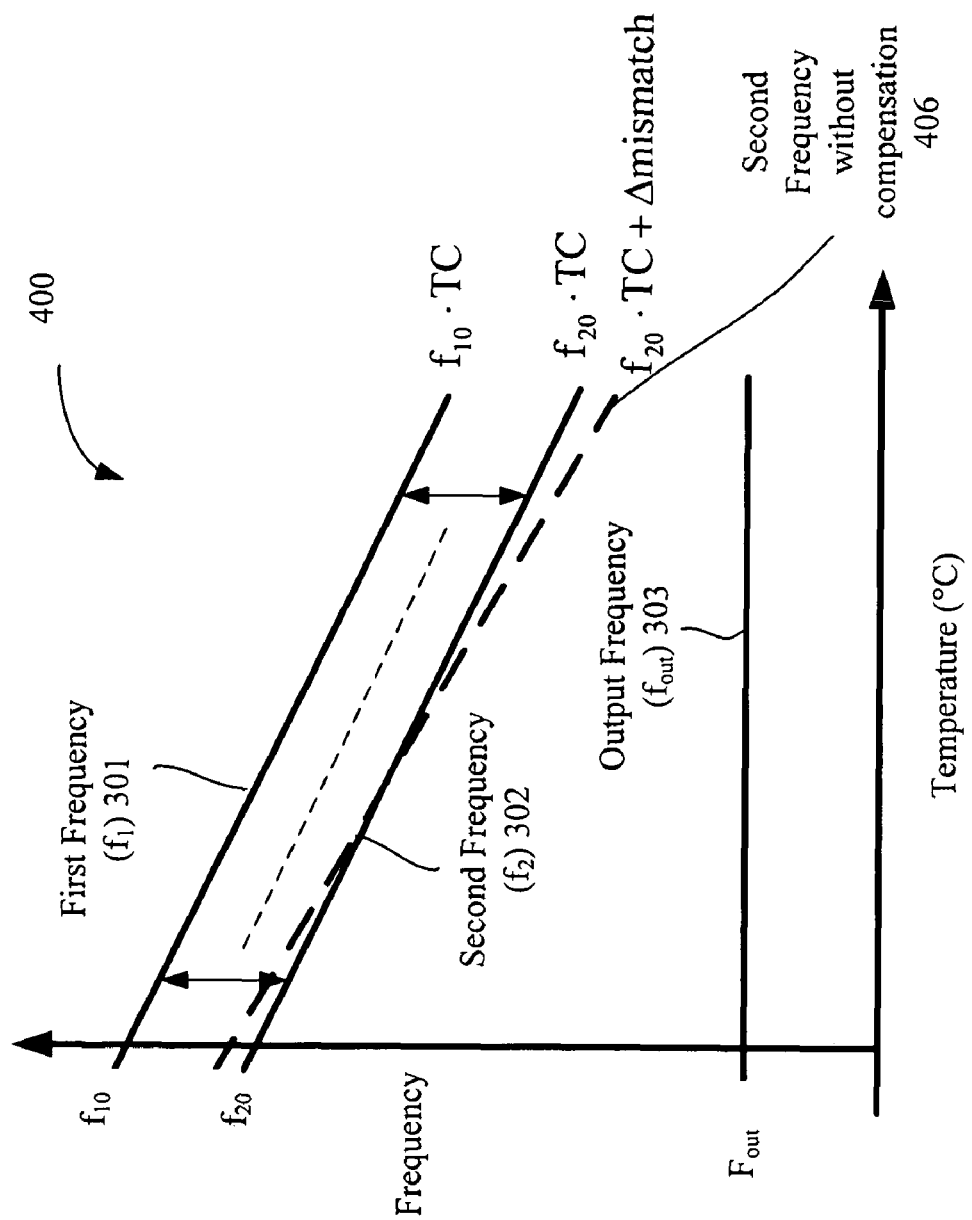
FIG. 4 is a graph illustrating a compensated frequency response of two oscillator frequencies having a mismatch in temperature over a functional temperature range, according to one embodiment.

FIG. 4 is a graph 400 illustrating a compensated frequency response of two oscillator frequencies having a mismatch in temperature over a functional temperature range, according to one embodiment. The graph 400 illustrates the linear temperature coefficients of the two oscillators 320 and 330 over the functional temperature range. Although both the first frequency ($f_1$) 301 and second frequency ($f_2$) 302 decrease over the temperature range, unlike the first and second frequencies 101 and 102 of the temperature sensor 100, the first and second frequencies 301 and 302 decrease at the same rate over the temperature range, since the frequencies have been matched and locked at the desired frequency ratio. The frequencies $f_{10}$ and $f_{20}$ represent the frequencies of the first and second frequencies 301 and 302 at the trimming temperature. The frequency ratio of the first and second frequencies at the trimming temperature may be set to the desired frequency ratio, however, as the temperature increases, the desired frequency ratio remains constant. The desired frequency ratio may remain constant by the DFD circuit 310 modifying one or both frequencies to compensate for the mismatch between the temperature coefficients of the two oscillators as the temperature increases. In one embodiment, the DFD circuit 310 keeps the two oscillators locked by pulling one or both resonators to keep the frequency ratio constant over the temperature range. It should be noted that matching and locking the two oscillators to keep the frequency ratio constant may be easier than achieving an absolute temperature coefficient ($TC_f$) which is zero across process variations.

In the depicted embodiment, the second frequency ($f_2$) 102 is tuned first to obtain the desired frequency ratio at the trimming temperature, and then subsequently tuned to maintain the desired frequency ratio over the temperature range. For example, towards the upper end of the temperature range, the first frequency ($f_1$) 301 is represented by the following equation (7), and the second frequency ($f_2$) 302 is represented by the following equation (8), where $TC_{f1}$ and $TC_{f2}$ are the temperature coefficients of the first and second oscillators 320 and 330, respectively.

$$f_1 = f_{10} \cdot TC_{f1} \quad (7)$$

$$f_2 = f_{20} \cdot TC_{f2} \quad (8)$$

As a result of the correcting the mismatch using the DFD circuit 310, the resulting output, output frequency ($f_{out}$) 303, remains constant over the entire temperature range. To further illustrate the compensation for the mismatch, the second frequency without any compensation 406 has been included in the graph as a dashed line. The second frequency without any compensation is expressed in the equation (6) above, as described with respect to FIG. 2.

Figure 5:
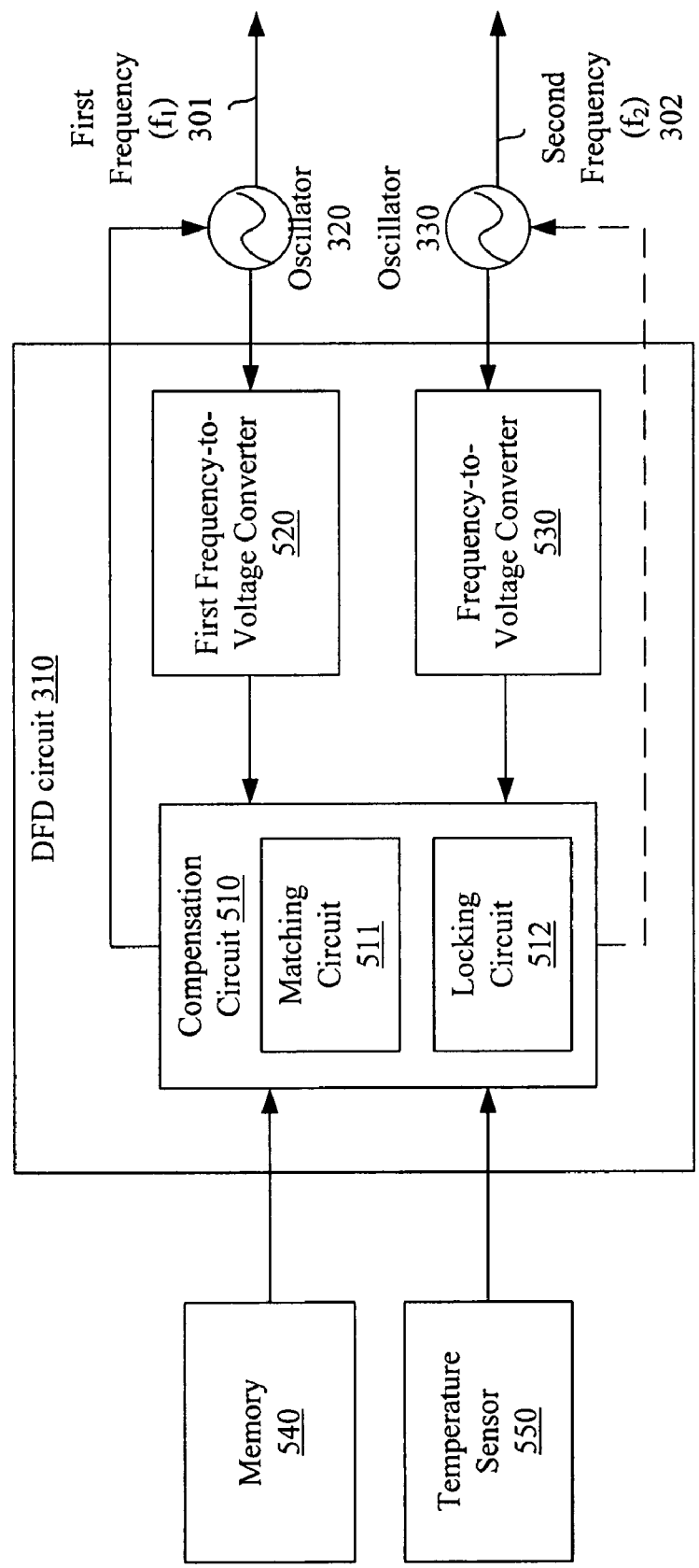
FIG. 5 is a block diagram of one embodiment of the DFD circuit of FIG. 3.

FIG. 5 is a block diagram of one embodiment of the DFD circuit of FIG. 3. In this embodiment, the DFD circuit 310 includes a compensation circuit 510, and two frequency-to-voltage converters (FVCs) 520 and 530, which are coupled to receive the first and second frequencies 301 and 302 from the first and second oscillators 320 and 330, respectively. The two FVCs 520 and 530 are disposed in the feedback loop of the two oscillators, and operate to convert the first and second frequencies 301 and 302 to a first voltage and a second voltage, respectively. The compensation circuit 510, which receives the first and second voltages, operates to match and lock a voltage difference between the first and second voltages, which correspond to a matched frequency difference at the desired frequency ratio. By matching and locking the voltage difference, the first and second frequencies 301 and 302 can be matched and locked at the desired frequency ratio over the temperature range.

In the depicted embodiment, the compensation circuit 510 includes a matching circuit 511 and a locking circuit 512 to match and lock the first and second voltages that correspond to the first and second frequencies 301 and 302. In particular, the matching circuit 511 is coupled to receive the first and second voltages from the FVCs 520 and 530. The matching circuit 511 can modify at least one of the first or second capacitive loads to match the voltage difference between the first and second voltages receives at the matching circuit 511. This matched voltage difference corresponds to the matched frequency difference, as the matching circuit 511 provides feedback voltage(s) to tune one or both oscillators 320 and 330 to obtain and/or maintain the desired frequency ratio. The locking circuit 512 is also coupled to receive the first and second voltages from either the matching circuit 511 or the two FVCs 520 and 530. The locking circuit 512 can lock the first and second voltages at the voltage difference to maintain the first and second frequencies at the desired frequency ratio over the temperature range when the first and second frequencies are matched.

Using the matching circuit 511 and locking circuit 512, the compensation circuit 510 can tune one or both oscillators 320 and 330 to match the first and second frequencies 301 and 302 at the desired frequency ratio, and to lock the first and second frequencies 301 and 302 at the desired frequency ratio over the entire temperature range. The compensation circuit 510 provides control voltages which are fed back into each of the two oscillators 320 and 330 to tune one or both frequencies of the oscillators 320 and 330. In this embodiment, the oscillators 320 and 330 are tunable oscillators by a control voltage. In other embodiments, the oscillators 320 and 330 may be tunable using other techniques known by those of ordinary skill in the art, such as current-controlled tunable oscillators, or the like.

In another embodiment, a memory 540 is coupled to the compensation circuit 510. The memory circuit 540 may store initial frequency values for the first and second oscillators 320 and 330. The initial frequency values (e.g., initial shifts) may be programmed into memory, such as an EPROM, one time as an initial calibration of a clock circuit. Alternatively, the initial frequency values may be stored into other types of memory known by those of ordinary skill in the art, such as memories that allow these values to be reprogrammed. The initial frequency values may be represented as count values that are received by the compensation circuit 510. The count values may represent the amount of initial shift in frequency required to tune the frequency of the first and/or second frequencies 301 and 302. In one embodiment, the initial frequency values are pre-defined (e.g., hard-coded values). Alternatively, the initial frequency values may be programmed by the user (e.g., programmable values). The memory 540 may also store a temperature profile. The temperature profile indicates, for example, the amount of change in frequency per degree changes in temperature. The temperature profile may be specific to the types of oscillators that are being used. Typically, the temperature profile is representative of a graph of the resonance frequency of the oscillator over a range of temperatures. The temperature profile is indicative of the temperature characteristics (e.g., temperature coefficient) of the oscillator.

In another embodiment, a temperature sensor 550 is coupled to the compensation circuit 510. The compensation circuit 510 is configured to receive a temperature measured by the temperature sensor 550. The measured temperature may be an absolute temperature or a relative temperature. The compensation circuit 510 may compare the measured temperature to the temperature profile stored in memory to determine the required shift in frequency to compensate for temperature. For example, the compensation circuit 510 determines the shift required (e.g., 40 ppm for each degree change) given the currently measured temperature by the temperature sensor 550 (referred to herein as the temperature-compensated shift). The compensation circuit 510 can use the initial frequency shift and/or the temperature-compensated shift in tuning one or both first and second frequencies 301 and 302. As such, the DFD circuit 310 can compensate for the effects of temperature due to the mismatches in temperature coefficients, maintaining the desired frequency ratio over the temperature range.

In one embodiment, the matching circuit 511 is a variable capacitive load that can be modified to change the voltage which is feedback to the oscillator to tune the oscillators up or down in frequency in order to match the two frequencies at the desired frequency ratio. In one embodiment, the matching circuit 511 modifies at least one or both capacitive loads to match a voltage difference between the first and second voltages received from the FVCs. The matched voltage difference between the first and second voltages corresponds to a matched frequency difference between the first and second frequencies. In one embodiment, the variable capacitive load is a varactor. Alternatively, other variable capacitive loads may be used, such as a capacitor bank, where more or less capacitors of the capacitor bank are connected as part of the capacitive load to modify the capacitance value of the variable capacitive load. Alternatively, the matching circuit 511 can be other tuning circuits that can tune one or both frequencies to obtain the desired frequency ratio between the two frequencies. In another embodiment, the matching circuit 511 also includes circuitry that can read initial shift values stored in memory, and/or circuitry to determine the required shift based on a temperature profile stored in memory and a measured temperature.

In one embodiment, the locking circuit 511 is configured in a current mirror configuration which forces the currents in each of the branches of the current mirror to be equal, locking the first and second voltages, which ultimately lock the first and second frequencies in the desired frequency ratio, as determined by the ratio between the capacitive loads of each branch of the current mirror. Alternatively, the locking circuit 511 may be other circuits known by those of ordinary skill in the art which maintain the first and second frequencies at the desired frequency ratio over the temperature range when the first and second frequencies have been matched by the matching circuit. It should be noted that although the matching circuit 511 and locking circuit 512 have been described as being separate circuits, in other embodiments, the functionality performed by the matching circuit 511 and the locking circuit 512 may be performed in one circuit. Similarly, the compensation circuit 510 and the FVCs 520 and 530 may be implemented in the same circuit.

Figure 6:
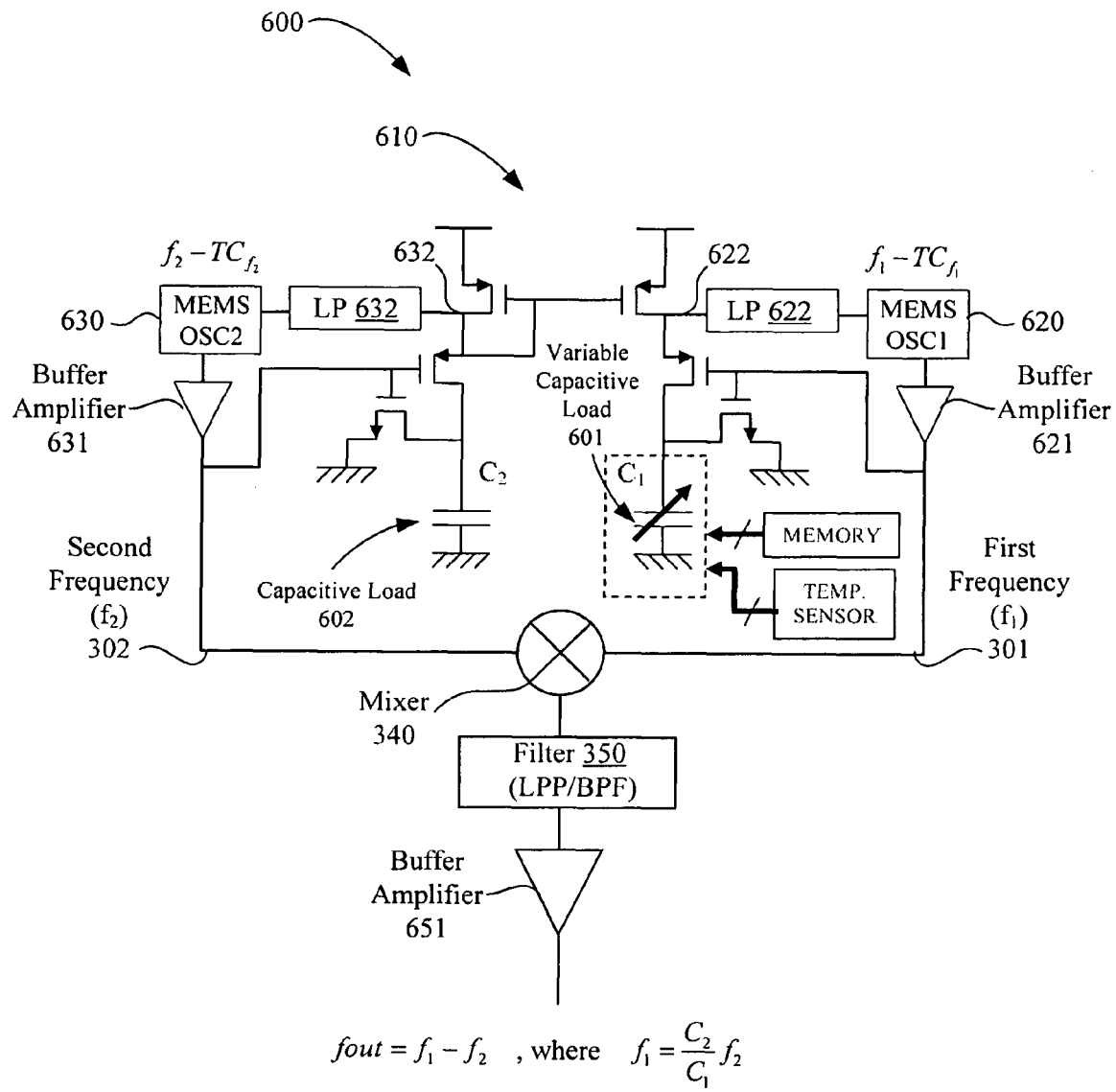
FIG. 6 is a circuit diagram of one embodiment of a circuit having a DFD circuit and two MEMS oscillators.

FIG. 6 is a circuit diagram of one embodiment of a circuit 600 having a DFD circuit 610 and two MEMS oscillators 620 and 630. The DFD circuit 610 is coupled to receive the first frequency 310 ($f_1$-$TC_{f1}$) from the first MEMS oscillator 620 through a first buffer amplifier 621, and the second frequency 302 ($f_2$-$TC_{f2}$) from the second MEMS oscillator 630 through a second buffer amplifier 631. The DFD circuit 610 includes multiple transistors that make up each of the two FVCs, each having a capacitive load. The two FVCs are disposed in a current mirror configuration, which forces the current in each branch to be equal (e.g., locking circuit). The current mirror operates to lock the two MEMS oscillators 620 and 630 to each other so that the first and second frequencies 301 and 302 maintain a constant frequency ratio over a temperature range. The first and second frequencies 301 are the switching frequencies of the FVCs and determine the current in each branch, as expressed in the following equations (9), where $\omega_i$ being the pulsation.

$$I_1 = \omega_1 \cdot C_1 \text{ and } I_2 = \omega_2 \cdot C_2 \tag{9}$$

The DFD circuit 610 includes a variable capacitive load 601, which can be modified to match the frequency ratio at the desired frequency ratio, and a fixed capacitive load 602. The variable capacitive load 601 may be a capacitor network, a varactor, a capacitor bank, or the like. In this embodiment, the ratio of the frequencies is expressed by the following equation (10), where $C_1$ represents the capacitance value of the variable capacitive load 601, and $C_2$ represents the capacitance value of the fixed capacitive load 602.

$$f_1 = \frac{C_2}{C_1} f_2 \tag{10}$$

The capacitance values of the capacitive loads and the current in each of the branches set the control voltages 622 and 632, which are fed back into each of the MEMS oscillators 620 and 630, respectively. The control voltages 622 and 632 may optionally pass through the low pass filters 622 and 632, respectively, to the MEMS oscillators 620 and 630. The DFD circuit 610 modifies the variable capacitive load 601 (e.g., matching circuit 511) to tune the first frequency 301 to obtain the desired frequency ratio between the first and second frequencies 301 and 302. Once the DFD circuit 610 has obtained the desired frequency ratio, the current mirror configuration of the DFD circuit 610 (e.g., locking circuit 512) locks the two MEMS oscillators 620 and 630 to each other so that the first and second frequencies 301 and 302 maintain a constant frequency ratio over the temperature range. In this embodiment, only the first frequency 301 is tuned using the variable capacitive load 601; however, in other embodiments, the capacitive load 602 may also be a variable capacitive load which can tune the second frequency 302, instead of, or in addition the variable capacitive load 601 which tunes the first frequency 301. The MEMS oscillators 620 and 630 are designed to be voltage controllable, for example, through a varactor or electrostatic pulling, or other techniques known by those of ordinary skill in the art. Although the embodiments of FIG. 6 include MEMS oscillators, in other embodiments, the oscillators may be other types of oscillators, such as LC, RC, quartz oscillators, or the like. The technique used to control the frequency of the oscillator may depend upon the type of oscillator used.

In other embodiments, the DFD circuit 610 can also use information stored in memory, as well as the temperature measured by the temperature sensor to change the variable capacitive load 601 to tune the first frequency 301 and/or the second frequency 302 to obtain the desired frequency ratio and/or to maintain the desired frequency ratio between the first and second frequencies 301 and 302 over the temperature range. Using the information stored in memory and/or the measured temperature may increase the frequency response to obtain and/or to maintain the frequencies at the desired frequency ratio.

The mixer 340 mixes the first frequency ($f_1$) 301 and the second frequency ($f_2$) 302, and the output frequency ($f_{out}$) 303 of the mixer 340 is applied through the filter 350 and the buffer amplifier 651. The resulting output signal is represented in the following equation (11).

$$f_{out} = f_1 - f_2 \text{ where } f_1 = \frac{C_2}{C_1} f_2 \tag{10}$$

The output signal may be applied to another circuit, such as the counter 360, to measure the frequency difference in terms of a digital count value, or the like. As previously described, the counter may generate a count 305 ($N_0$) which is a digital representation of the signal frequency of the output frequency ($f_{out}$).

Figure 7:
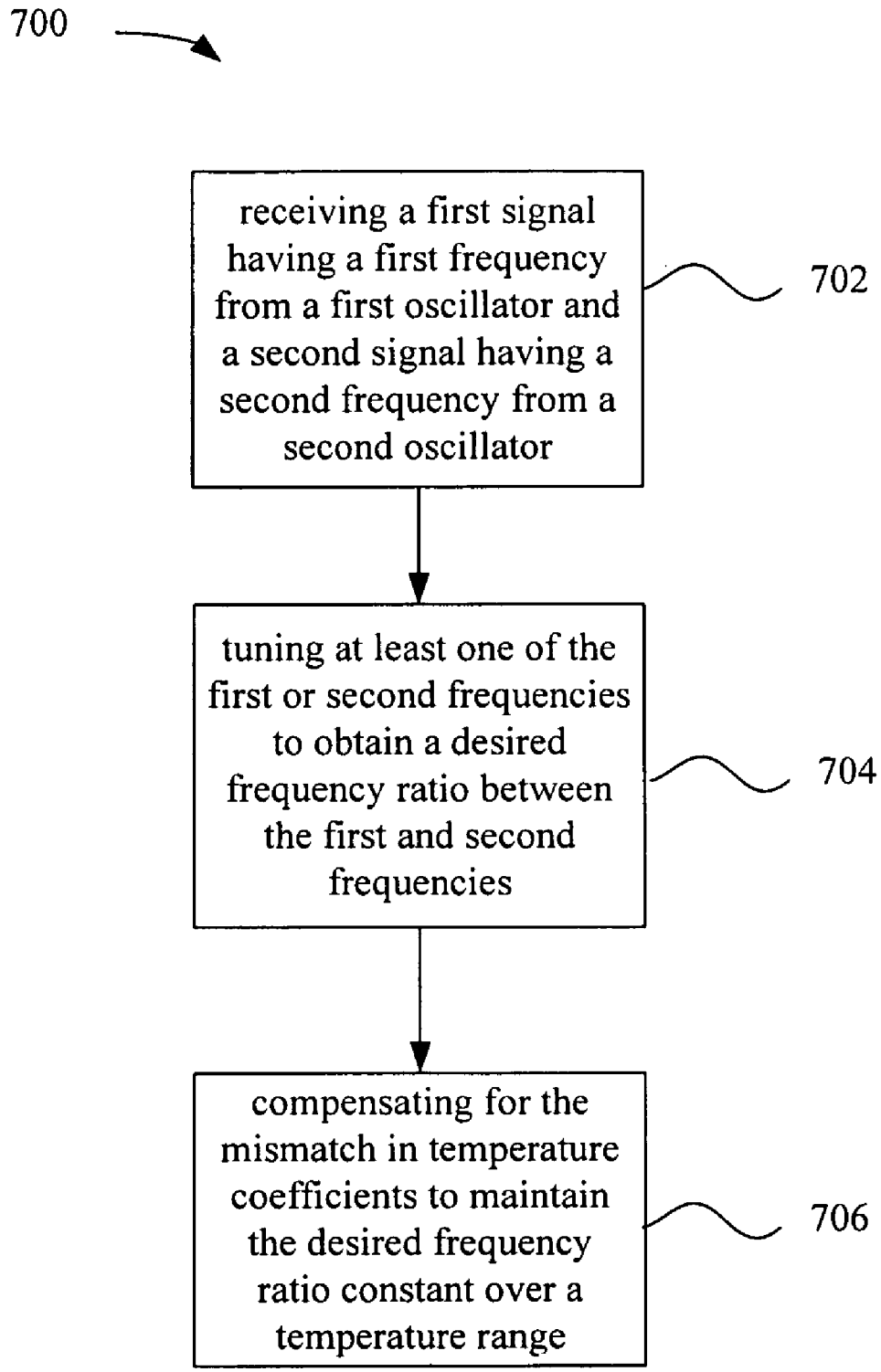
FIG. 7 is a flow diagram of one embodiment of a method for compensating for a mismatch in temperature coefficients of two oscillators to match a desired frequency ratio over a temperature range.

FIG. 7 is a flow diagram of one embodiment of a method 700 for compensating for a mismatch in temperature coefficients of two oscillators to match a desired frequency ratio over a temperature range. The method 700 begins by receiving a first signal having a first frequency (e.g., 301) from a first oscillator (e.g., 320) and a second signal having a second frequency (e.g., 302) from a second oscillator (e.g., 330) (block 702). Next, the method 700 tunes at least one of the first or second frequencies (e.g., 301 or 302) to obtain a desired frequency ratio between the first and second frequencies (block 704). Once the desired frequency ratio is obtained, the method 700 compensates for a mismatch in temperature coefficients of the first and second oscillators to maintain the desired frequency ratio constant over a temperature range (block 706).

In one embodiment, in order to obtain and maintain the desired frequency ratio, the method 700 determines a required shift amount to tune one of or both frequencies to obtain the desired frequency ratio initially (e.g., at the trimming temperature), and consequently tunes one or both frequencies by the required shift amount to tune one or both frequencies to maintain the desired frequency ratio. Once the desired frequency ratio has been obtained, the method locks the first and second frequencies at the desired frequency ratio to maintain the desired frequency ratio constant over the temperature range. In one embodiment, the required shift amount is determined by determining a capacitance value for a tunable capacitive load of a FVC disposed in a feedback loop of one of the oscillators. In another embodiment, the required shift amount is determined by determining a first capacitance value for a first tunable capacitive load of a first FVC disposed in a feedback loop of a first oscillator, and determining a second capacitance value for a second tunable capacitive load of a second FVC disposed in a feedback loop of a second oscillator. The first and second capacitance values have a proportional relationship that sets the desired frequency ratio between the first and second frequencies.

In one embodiment, the method 700 is performed by the DFD circuit 310. Alternatively, the method 700 may be performed by other circuits, such as the DFD circuit 610, or the like.

Figure 8:
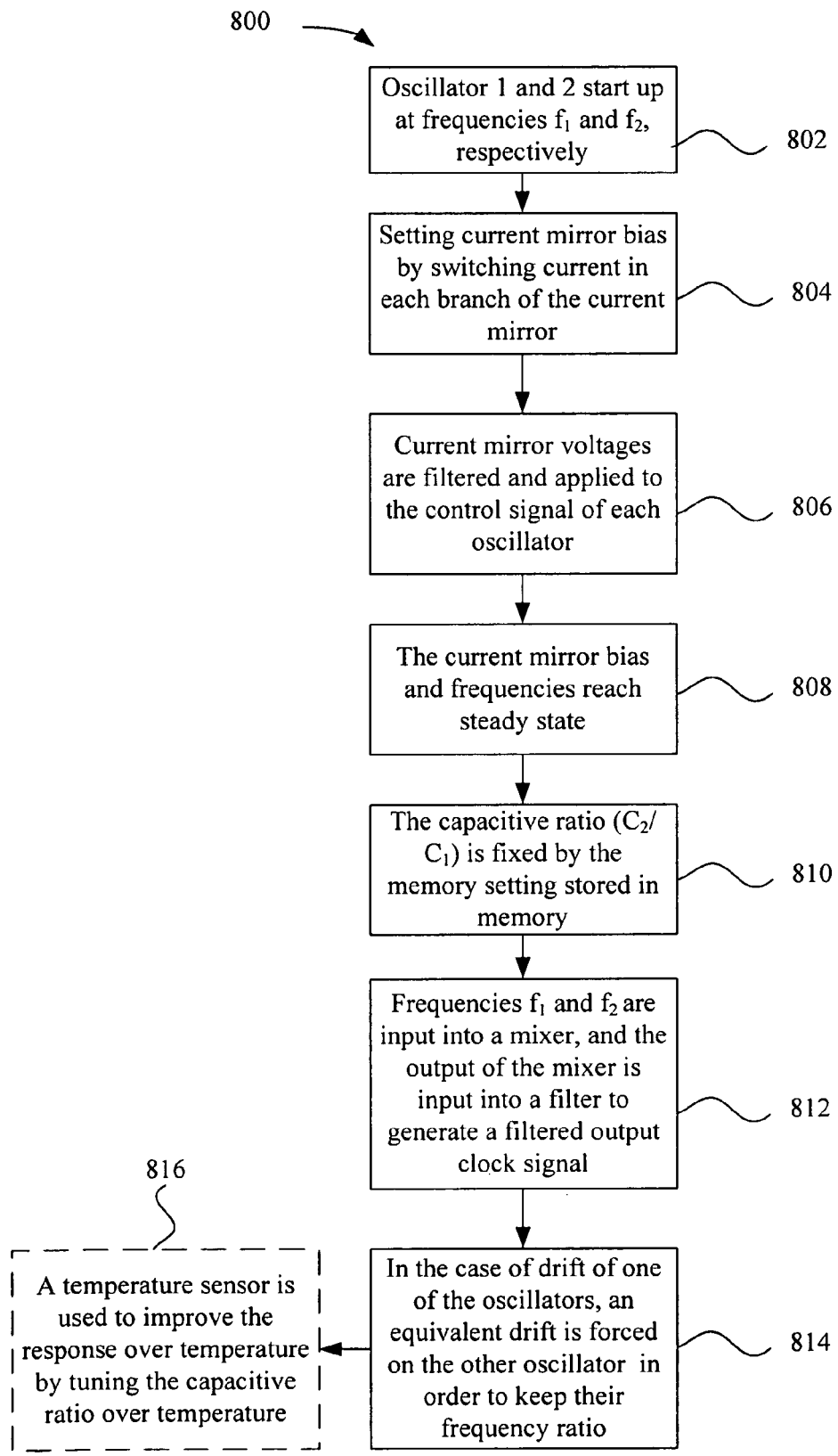
FIG. 8 is a flow diagram of another embodiment of a method for compensating for a mismatch in temperature coefficients of two oscillators to match a desired frequency ratio over a temperature range.

FIG. 8 is a flow diagram of another embodiment of a method 800 for compensating for a mismatch in temperature coefficients of two oscillators to match a desired frequency ratio over a temperature range. The method 800 begins by starting the first oscillator 320 at the first frequency ($f_1$) 301 and the second oscillator 330 at a second frequency ($f_2$) 302 (block 802). The method 800 sets the current mirror bias by switching the current in each branch of the current mirror (block 804). The current mirror voltages are filtered and applied to the control signals of each oscillator (block 806). In particular, the current mirror voltages pull the frequency of each oscillator. The current mirror bias and frequencies reach stead state once the first frequency ($f_1$) 301 is equal to the capacitive ratio (e.g., $C_2/C_1$) times the second frequency ($f_2$) 302 (block 808), as expressed above in equation (10). The capacitive ratio (e.g., $C_2/C_1$) may be set by the memory setting stored in memory to match the frequency specification (block 810). The first and second frequencies ($f_1$) 301 and ($f_2$) 302 are input into a mixer (e.g., mixer 340), and the output of the mixer is input into a filter (e.g., filter 350) to generate a filtered output clock signal (block 812). In the case of drift of one of the oscillators (e.g., 320 or 330), the method 800 forces an equivalent drift on the other oscillator in order to keep their frequency ratio (block 814).

In another embodiment, the method 800 also uses a temperature sensor (e.g., temperature sensor 550) to improve the response over temperature, by tuning the capacitive ratio (e.g., $C_2/C_1$) over temperature, for example, through parameter selection in the memory (block 816) based on the measured temperature. In one embodiment, the method 800 is performed by the DFD circuit 310. Alternatively, the method 800 may be performed by other circuits, such as the DFD circuit 610, or the like.

What is claimed is:
1. An apparatus, comprising:
a first oscillator to provide a first signal having a first frequency;
a second oscillator to provide a second signal having a second frequency, wherein the first and second oscillators have a mismatch in temperature coefficients; and
a differential frequency discriminator circuit coupled to receive the first and second signals, the differential frequency discriminator circuit being further coupled to control at least one of the first or second oscillators so as to control the frequency of the first signal provided by the first oscillator, to control the frequency of the second signal provided by the second oscillator, or a combination thereof;
the differential frequency discriminator circuit being configured to control at least one of the first or second oscillators so as to control the frequency of at least one of the respective first or second signals based at least in part on the current frequency of the first and second signals to compensate for the mismatch in temperature coefficients and to match a given desired frequency difference between the first and second frequencies over a temperature range.

2. The apparatus of claim 1, wherein the differential frequency discriminator circuit is configured to control at least one of the first or second oscillators to tune at least one of the respective first or second frequencies to obtain a desired frequency ratio between the first and second frequencies, and to lock the first and second frequencies at the desired frequency ratio to maintain the desired frequency ratio constant over the temperature range.

3. The apparatus of claim 1, wherein the differential frequency discriminator circuit comprises:
a first frequency-to-voltage converter (FVC) to receive the first signal and to covert the first frequency of the first signal to a first voltage, wherein the first FVC is disposed in a feedback loop of the first oscillator, and wherein the first FVC has a first capacitive load;
a second FVC to receive the second signal and to covert the second frequency of the second signal to a second voltage, wherein the second FVC is disposed in a feedback loop of the second oscillator, and wherein the second FVC has a second capacitive load; and
a compensation circuit to receive the first and second voltages, to match a voltage difference between the first and second voltages which corresponds to a matched frequency difference at the desired frequency ratio, and to lock the first and second voltages at the voltage difference to lock the first and second frequencies at the desired frequency ratio over the temperature range when the first and second frequencies are matched.

4. The apparatus of claim 3, wherein the compensation circuit comprises:
a matching circuit coupled to receive the first and second voltages, the matching circuit to modify at least one of the first or second capacitive loads to match a voltage difference between the first and second voltages received at the matching circuit, wherein the matched voltage difference between the first and second voltages corresponds to a matched frequency difference between the first and second frequencies; and
a locking circuit coupled to receive the first and second voltages, the locking circuit to lock the first and second voltages at the voltage difference to maintain the first and second frequencies at the desired frequency ratio over the temperature range when the first and second frequencies are matched.

5. The apparatus of claim 3, wherein at least one of the first and second capacitive loads comprises a varactor, wherein the varactor is varied by the compensation circuit to modify the at least one of the first or second capacitive loads.

6. The apparatus of claim 3, wherein at least one of the first or second capacitive loads comprises a capacitor bank, wherein more or less capacitors of the capacitor bank are connected as part of the capacitive load by the compensation circuit to modify the at least one of the first and second capacitive loads.

7. The apparatus of claim 3, further comprising a memory coupled to the compensation circuit, wherein the memory is configured to store an initial value for tuning the first frequency to an initial frequency.

8. The apparatus of claim 7, wherein the memory is configured to store a temperature profile of the apparatus.

9. The apparatus of claim 3, further comprising a register coupled to the compensation circuit, wherein the register is configured to store an initial value for tuning the first frequency to an initial frequency.

10. The apparatus of claim 3, further comprising:
a memory coupled to the compensation circuit, the memory to store a temperature profile of the apparatus; and
a temperature sensor coupled to the compensation circuit, the temperature sensor to measure a temperature of the apparatus, and wherein the differential frequency discriminator circuit is configured to receive the temperature from the temperature sensor and to provide a control signal to modify the at least one of the first or second capacitive loads to tune at least one of the first or second frequencies to have the desired frequency ratio over the range of temperature using the measured temperature and the temperature profile.

11. The apparatus of claim 1, wherein the differential frequency discriminator circuit comprises frequency-to-voltage converters (FVCs) having multiple transistors disposed in a current mirror configuration, each branch of the current mirror includes a capacitive load, the FVCs to receive the first and second frequencies from the first and second oscillators, to convert the first and second frequencies to a first voltage and a second voltage respectively, wherein the first and second voltages are used by the differential frequency discriminator circuit to tune at least one of the first or second frequencies to obtain a desired frequency ratio between the first and second frequencies by varying one or both capacitive loads, and wherein the current mirror configuration locks the first and second frequencies at the desired frequency ratio to maintain the desired frequency ratio constant over the temperature range by forcing the current in each branch of the current mirror to be equal.

12. The apparatus of claim 1, further comprising a mixer coupled to receive the first and second signals and to generate an output signal, the frequency of at least one of the first or second signals being controlled by the differential frequency discriminator circuit before it is received by the mixer.

13. The apparatus of claim 12, further comprising a filter coupled to receive the output signal and to filter the output signal to generate a filtered signal.

14. The apparatus of claim 1, wherein the first and second oscillators are Microelectromechanical systems (MEMS) oscillators.

15. The apparatus of claim 14, wherein the first and second oscillators each comprise a double ended tuning fork (DEFT) resonator.

16. The apparatus of claim 1, wherein the differential frequency discriminator circuit comprises part of a semiconductor integrated circuit and the first and second oscillators are formed on the integrated circuit.

17. The apparatus of claim 16, wherein the semiconductor integrated circuit comprises a silicon substrate and the first and second oscillators comprise silicon germanium.

18. A method, comprising:
receiving a first signal having a first frequency from a first oscillator and a second signal having a second frequency from a second oscillator, wherein the first and second oscillators have a mismatch in temperature coefficients;
controlling at least one of the first or second oscillators so as to control the frequency of at least one of the respective first or second signals based at least in part on the current frequency of the received first and second signals to tune at least one of the first or second frequencies to obtain a desired frequency ratio between the first and second frequencies; and
controlling at least one of the first or second oscillators so as to control the frequency of at least one of the respective first or second signals based at least in part on the current frequency of the received first and second signals to compensate for the mismatch in temperature coefficients to maintain the desired frequency ratio constant over a temperature range.

19. The method of claim 18, further comprising determining the frequency difference between the first and second frequencies as a measure of temperature, wherein the frequency difference is temperature dependent.

20. The method of claim 18, further comprising:
determining a required shift amount to tune the at least one of the first or second frequencies to obtain the desired frequency ratio, wherein tuning the at least one of the first or second frequencies to obtain the desired frequency ratio comprises tuning the at least one of the first or second frequencies by the required shift amount; and
locking the first and second frequencies at the desired frequency ratio to maintain the desired frequency ratio constant over the temperature range.

21. The method of claim 20, wherein said determining the required shift amount comprises determining a capacitance value for a tunable capacitive load of a frequency-to-voltage converter disposed in a feedback loop of the first oscillator.

22. The method of claim 20, wherein said determining the required shift amount comprises:
determining a first capacitance value for a tunable capacitive load of a first frequency-to-voltage converter coupled to the first oscillator; and
determining a second capacitance value for a tunable capacitive load of a second frequency-to-voltage converter coupled to the second oscillator, wherein the first and second capacitance values have a proportional relationship that sets the desired frequency ratio between the first and second frequencies.

23. A temperature sensor, comprising:
first and second sensor oscillators, wherein the first and second sensor oscillators have different temperature characteristics;
a differential frequency discriminator circuit coupled to the first and second sensor oscillators to receive a first signal having a first frequency from the first sensor oscillator and a second signal having a second frequency from the second sensor oscillator, and to control at least one of the first or second sensor oscillators so as to control the frequency of at least one of the respective first or second signals based at least in part on the current frequency of the first and second signals to compensate for the different temperature characteristics in order to match a frequency difference between the first and second frequencies over a temperature range; and
means for determining the frequency difference as a measure of temperature, wherein the frequency difference is temperature dependent.

24. The temperature sensor of claim 23, wherein the differential frequency discriminator circuit is configured to match the difference between the first and second frequencies by maintaining a desired frequency ratio between the first and second frequencies over the temperature range.

25. The apparatus of claim 1, wherein the differential frequency discriminator circuit is further coupled to control each of the first and second oscillators so as to control the frequency of the first signal provided by the first oscillator and to control the frequency of the second signal provided by the second oscillator; and wherein the differential frequency discriminator circuit is configured to control each of the first and second oscillators so as to control the frequency of each of the respective first or second signals based at least in part on the current frequency of the first and second signals to compensate for the mismatch in temperature coefficients and to match a given desired frequency difference between the first and second frequencies over a temperature range.

26. The apparatus of claim 1, wherein the differential frequency discriminator circuit is configured to:
   compare a currently measured temperature of the apparatus to a temperature profile to determine a shift in frequency required to compensate for changes in temperature; and
   control at least one of the first or second oscillators to control the frequency of at least one of the respective first or second signals so as to cause the determined required shift in frequency of at least one of the respective first or second signals to compensate for the mismatch in temperature coefficients to match the given desired frequency difference between the first and second frequencies.

27. The apparatus of claim 12, wherein the mixer and the differential frequency discriminator circuit are separate components.

28. The method of claim 18, further comprising controlling each of the first and second oscillators so as to control the frequency of the first signal provided by the first oscillator and to control the frequency of the second signal provided by the second oscillator based at least in part on the current frequency of the first and second signals to compensate for the mismatch in temperature coefficients and to match a given desired frequency difference between the first and second frequencies over a temperature range.

29. The method of claim 18, further comprising:
   comparing a currently measured temperature to a temperature profile to determine a shift in frequency required to compensate for changes in temperature; and
   controlling at least one of the first or second oscillators to control the frequency of at least one of the respective first or second signals so as to cause the determined required shift in frequency of at least one of the respective first or second signals to compensate for the mismatch in temperature coefficients to match the given desired frequency difference between the first and second frequencies.

30. The method of claim 18, further comprising receiving the first and second signals after said step of controlling; and mixing the received first and second signals to generate an output signal therefrom.

* * * * *